(12) United States Patent
Lee et al.

(10) Patent No.: US 11,295,999 B2
(45) Date of Patent: Apr. 5, 2022

(54) COMPOSITION FOR ENCAPSULATING ORGANIC ELECTRONIC ELEMENT

(71) Applicant: LG CHEM, LTD., Seoul (KR)

(72) Inventors: Seung Min Lee, Daejeon (KR); So Young Kim, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 223 days.

(21) Appl. No.: 16/606,182

(22) PCT Filed: Apr. 20, 2018

(86) PCT No.: PCT/KR2018/004594
§ 371 (c)(1),
(2) Date: Oct. 17, 2019

(87) PCT Pub. No.: WO2018/194410
PCT Pub. Date: Oct. 25, 2018

(65) Prior Publication Data
US 2020/0127206 A1   Apr. 23, 2020

(30) Foreign Application Priority Data

Apr. 21, 2017 (KR) .................. 10-2017-0051447

(51) Int. Cl.
*H01L 23/29* (2006.01)
*C08G 59/24* (2006.01)
(Continued)

(52) U.S. Cl.
CPC ............ *H01L 23/293* (2013.01); *C08G 59/24* (2013.01); *C08L 63/00* (2013.01); *H01L 23/29* (2013.01);
(Continued)

(58) Field of Classification Search
CPC ......... H01L 23/16; H01L 23/18; H01L 23/28; H01L 23/29; H01L 23/293; H01L 23/31;
(Continued)

(56) References Cited

U.S. PATENT DOCUMENTS 9,685,597 B2   6/2017  Marukawa et al.
2003/0059618 A1   3/2003  Takai
(Continued)

FOREIGN PATENT DOCUMENTS

CN   102822731         4/2016
CN   109715749 A       5/2019
(Continued)

OTHER PUBLICATIONS

Office Action of Japanese Patent Office in Appl'n No. 2019-556603 dated Nov. 24, 2020.
(Continued)

*Primary Examiner* — Cheung Lee
(74) *Attorney, Agent, or Firm* — Dentons US LLP

(57) ABSTRACT

Provided is a composition for encapsulating an organic electronic element and an organic electronic device comprising the same, and an encapsulating composition that can form a structure capable of effectively blocking moisture or oxygen introduced from the outside into an organic electronic device, thereby securing a lifetime of the organic electronic device, and that can be applied to a top-emitting organic electronic device to prevent physical and chemical damage of organic electronic elements, while having excellent optical properties and processability, and an organic electronic device comprising the same.

17 Claims, 1 Drawing Sheet

(51) Int. Cl.
   *C08L 63/00* (2006.01)
   *H01L 51/00* (2006.01)
   *H01L 51/52* (2006.01)
   *H01L 51/56* (2006.01)
   *H01L 23/31* (2006.01)

(52) U.S. Cl.
   CPC ...... *H01L 23/3157* (2013.01); *H01L 51/0035* (2013.01); *H01L 51/0043* (2013.01); *H01L 51/5253* (2013.01); *H01L 51/56* (2013.01)

(58) Field of Classification Search
   CPC ............. H01L 23/3157; H01L 23/3171; H01L 23/562; H01L 23/564; H01L 51/0032; H01L 51/0034; H01L 51/0035; H01L 51/0043; H01L 51/52; H01L 51/5237; H01L 51/5253; H01L 51/56; C08G 59/18; C08G 59/188; C08G 59/20; C08G 59/24; C08L 63/00; C08L 63/10
   See application file for complete search history.

(56) References Cited

U.S. PATENT DOCUMENTS

| | | |
|---|---|---|
| 2003/0201429 A1 | 10/2003 | He et al. |
| 2014/0072731 A1 | 3/2014 | Seo et al. |
| 2016/0126431 A1* | 5/2016 | Marukawa ............. C08G 59/24 257/100 |
| 2016/0163986 A1 | 6/2016 | Zhou |
| 2019/0225740 A1 | 7/2019 | Kim et al. |

FOREIGN PATENT DOCUMENTS

| | | |
|---|---|---|
| JP | 2004-231957 | 8/2004 |
| JP | 2007-056119 | 3/2007 |
| JP | 4924772 | 4/2012 |
| JP | 5671825 | 2/2015 |
| JP | 2015-044917 | 3/2015 |
| JP | 5703429 | 4/2015 |
| JP | 2015-137339 | 7/2015 |
| JP | 2015-196783 | 11/2015 |
| JP | 2016-051602 | 4/2016 |
| JP | 2016-058273 | 4/2016 |
| JP | 2016-536410 | 11/2016 |
| JP | 2016-210849 | 12/2016 |
| KR | 10-2009-0110132 | 10/2009 |
| KR | 10-2013-0040725 | 4/2013 |
| KR | 10-2013-0055552 | 5/2013 |
| KR | 10-2015-0119935 | 10/2015 |
| KR | 10-1595696 | 2/2016 |
| KR | 10-2016-0114358 | 10/2016 |
| KR | 10-2018-0036619 | 4/2018 |
| TW | 201542669 | 11/2015 |
| TW | 201704436 | 2/2017 |
| WO | 2014-192839 | 12/2014 |
| WO | 2015129670 | 9/2015 |
| WO | 2018062930 | 4/2018 |

OTHER PUBLICATIONS

Extended Search Report of European Patent Office in Appl'n No. 18787367.4, dated Mar. 31, 2020.

\* cited by examiner

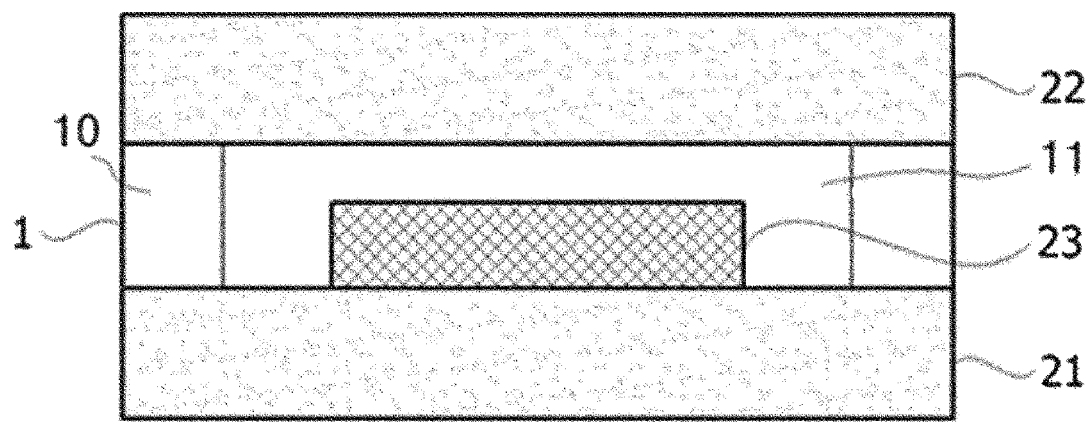

COMPOSITION FOR ENCAPSULATING ORGANIC ELECTRONIC ELEMENT

CROSS-REFERENCE TO RELATED APPLICATIONS

This application is a National Stage Application of International Application No. PCT/KR2018/004594 filed on Apr. 20, 2018, which claims the benefit of priority based on Korean Patent Application No. 10-2017-0051447 filed on Apr. 21, 2017, the disclosure of which is incorporated herein by reference in its entirety.

TECHNICAL FIELD

The present application relates to a composition for encapsulating an organic electronic element, an organic electronic device comprising the same, and a method for manufacturing the organic electronic device.

BACKGROUND ART

An organic electronic device (OED) means a device comprising an organic material layer that generates an alternating current of electric charges using holes and electrons, an example of which can include a photovoltaic device, a rectifier, a transmitter and an organic light emitting diode (OLED), and the like.

The organic light emitting diode (OLED) of the organic electronic devices has lower power consumption and faster response speed, as compared with the existing light source and is advantageous for thinning display devices or illuminations. In addition, the OLED has excellent spatial availability, thereby being expected to be applied in various fields covering various portable devices, monitors, notebooks, and televisions.

The OLED has an emission structure such as a bottom emission structure and a top emission structure. Among these, the top emission structure has a higher aperture ratio than the bottom emission structure, so that it is easy to implement with ultra-high resolution and it is possible to realize an element having high luminance, and excellent power consumption and life, and the like.

However, since the exit surface of the generated light must be colorless and transparent, the OLED has a limitation that the sealing material must be colorless and transparent. In addition, in order to form a uniform coating film, the sealing material used in the ODF (one drop filling) process at the time of sealing the OLED element must have a low viscosity and a small change with time, and it is required to provide a encapsulating composition capable of suppressing deterioration due to out-gas.

DISCLOSURE

Technical Problem

The present application provides an encapsulating composition which can form a structure capable of effectively blocking moisture or oxygen introduced from the outside into an organic electronic device, thereby securing a lifetime of the organic electronic device, and can be applied to a top-emitting organic electronic device to prevent physical and chemical damage of organic electronic elements, while having excellent optical properties and processability, and an organic electronic device comprising the same.

Technical Solution

The present invention relates to a composition for encapsulating an organic electronic element. The composition can be a pressure sensitive adhesive composition or an adhesive composition. The encapsulating composition can be, for example, an encapsulating material that is applied to sealing or encapsulating an organic electronic device such as an OLED. In one example, the encapsulating composition of the present application can be applied to sealing or encapsulating the top surface of an organic electronic element. Thus, after the encapsulating composition is applied to the encapsulation, it can be in the form of sealing the top surface of the organic electronic device.

In this specification, the term "organic electronic device" means an article or a device having a structure including an organic material layer that generates an alternating current of electric charges using holes and electrons between a pair of electrodes facing each other, an example of which can include a photovoltaic device, a rectifier, a transmitter and an organic light emitting diode (OLED), and the like, but is not limited thereto. In one example of the present application, the organic electronic device can be an OLED.

An exemplary composition for encapsulating an organic electronic element can comprise a curable compound; a thermal initiator; and a hardening retarder. Here, the encapsulating composition can satisfy Equation 1 below.

$$0.03 < R/P < 0.6 \quad \text{[Equation 1]}$$

In Equation 1, R is a part by weight of the hardening retarder relative to 100 parts by weight parts of the curable compound, and P is a part by weight of the thermal initiator relative to 100 parts by weight of the curable compound. In this specification, the part by weight can mean a ratio by weight between the respective components. Specifically, the R/P range can be within a range of 0.0305 to 0.550, 0.0307 to 0.530, 0.0308 to 0.500, or 0.0309 to 0.495.

As the present application provides an encapsulating composition that is applied to contact a top-emitting organic electronic element directly on the element, the composition should have excellent optical properties after curing, prevent damage to the element due to the out-gas generated upon curing the composition and also have processability that is capable of ensuring a sufficient pot life, while allowing a uniform coating film, and also requires thermal stability in high temperature processes. The present application can provide a composition for encapsulating an organic electronic element, which can simultaneously realize the optical properties, element\ reliability, processability and thermal stability by providing a composition satisfying the above-mentioned Equation 1. In addition, in order to realize the effects as above, the present application can control the kinds of compounds and the content of each composition, but is not limited thereto.

In an embodiment of the present application, the curable compound can be a cationic curable compound. Also, the curable compound can comprise at least one or more curable functional groups. The curable functional group can be, for example, one or more selected from a glycidyl group, an isocyanate group, a hydroxyl group, a carboxyl group, an amide group, an epoxide group, a cyclic ether group, a sulfide group, an acetal group and a lactone group. In addition, the curable compound can be a monofunctional compound or a compound having bifunctionality or more, and can be a combination of a monofunctional compound and a compound having bifunctionality or more, or a combination of compounds having bifunctionality or more. The curable compound realizes excellent heat resistance at high temperature and high humidity by realizing an appropriate degree of crosslinking to encapsulate an organic electronic element.

In one example, the curable compound can be included in the composition in a ratio of 70 wt % or more, 75 wt % or more, 80 wt % or more, 85 wt % or more, 90 wt % or more, 95 wt % or more, or 98 wt % or more. The upper limit is not particularly limited, but can be 99.9 wt % or 99.8 wt %.

In one example, the curable compound can comprise an epoxy compound having a cyclic structure in the molecular structure. In the epoxy compound having a cyclic structure in the molecular structure, ring constituent atoms in the molecular structure can be present in a range of 3 to 10, 4 to 8, or 5 to 7, and the number of cyclic structures in the compound can be 1 or more, or 2 or more and 10 or less. Also, in one example, the epoxy compound having a cyclic structure in the molecular structure can comprise at least two or more compounds that are different from each other. The type of the epoxy compound having a cyclic structure in the molecular structure is not particularly limited, but can include an alicyclic epoxy compound or an aromatic epoxy compound.

In one example, the alicyclic epoxy compound can be an epoxy cyclohexane compound containing a unit of Formula 1 below.

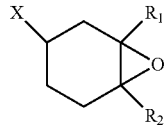

[Formula 1]

In Formula 1, $R_1$ and $R_2$ each independently is a hydrogen atom or an alkyl group having 1 to 4 carbon atoms, and X is an epoxy group-containing substituent.

Furthermore, the alicyclic epoxy compound can comprise a compound of Formula 2 below.

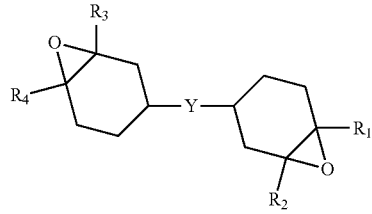

[Formula 2]

In Formula 2, Y is a single bond or one or more selected from the group consisting of a linear or branched alkylene group having 1 to 18 carbon atoms, —CO—, —O—CO—O—, —COO—, —O— and —CONN—, and $R_1$ to $R_4$ each independently is a hydrogen atom or an alkyl group having 1 to 4 carbon atoms.

As the alicyclic epoxy compound, an epoxycyclohexylmethyl epoxycyclo-hexanecarboxylate-based compound; an epoxycyclohexanecarboxylate-based compound of alkanediol; an epoxycyclohexylmethyl ester-based compound of dicarboxylic acid; an epoxycyclohexylmethyl ether-based compound of polyethylene glycol; an epoxycyclohexylmethyl ether-based compound of alkanediol; a diepoxytrispiro-based compound; a diepoxymonospiro-based compound; a vinylcyclohexene diepoxide compound; an epoxycyclopentyl ether compound or a diepoxy tricyclodecane compound, and the like can be used. They are stable even at high temperatures, colorless and transparent after curing, and have toughness and excellent surface hardness.

The alicyclic epoxy compounds as above can be exemplified by, for example, compounds of Formulas 3 to 7 below, respectively.

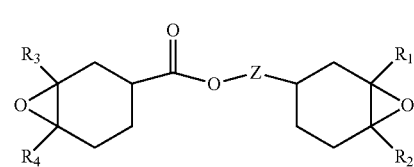

[Formula 3]

In Formula 3, $R_1$ to $R_4$ each is a hydrogen atom or an alkyl group having 1 to 4 carbon atoms and Z is an alkylene group having 1 to 4 carbon atoms.

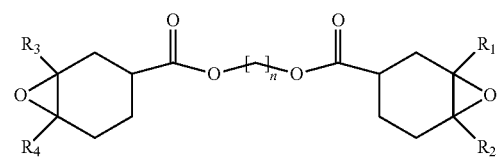

[Formula 4]

In Formula 4, $R_1$ to $R_4$ each is a hydrogen atom or an alkyl group having 1 to 4 carbon atoms and n is an integer of 1 to 20.

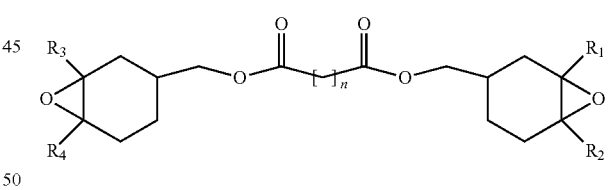

[Formula 5]

In Formula 5, $R_1$ to $R_4$ each is a hydrogen atom or an alkyl group having 1 to 4 carbon atoms and n is an integer of 1 to 20.

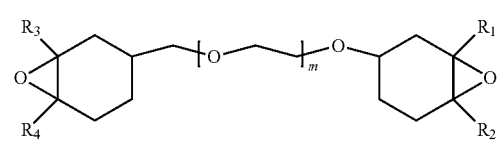

[Formula 6]

In Formula 6, $R_1$ to $R_4$ each is a hydrogen atom or an alkyl group having 1 to 4 carbon atoms and m is an integer of 1 to 20.

[Formula 7]

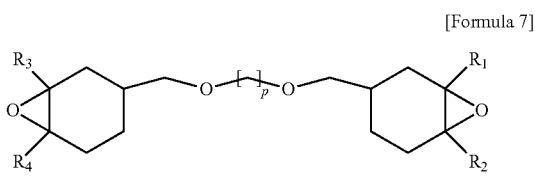

In Formula 7, $R_1$ to $R_4$ each is a hydrogen atom or an alkyl group having 1 to 4 carbon atoms and p is an integer of 1 to 20.

More specifically, the constituent alicyclic epoxy compound can be exemplified by bis(3,4-epoxycyclohexyl) oxalate, bis(3,4-epoxycyclohexylmethyl) adipate, bis(3,4-epoxy-6-methylcyclohexylmethyl) adipate, bis(3,4-epoxycyclohexylmethyl) piperate, 3,4-epoxycyclohexylmethyl (3,4-epoxy)cyclohexane carboxylate, 3,4-epoxycyclohexane carboxylate, 6-methyl-3,4-epoxycyclohexylmethyl (6-methyl-3,4-epoxy)cyclohexane carboxylate, 3,4-epoxy-2-methylcyclohexylmethyl(3,4-epoxy-2-methyl) cyclohexane carboxylate, 3,4-epoxy-3-methylcyclohexylmethyl(3,4-epoxy-3-methyl)cyclohexane carboxylate, 3,4-epoxy-5-methylcyclohexylmethyl(3,4-epoxy-5-methyl)cyclohexane carboxylate and their caprolactone adducts, limonene dioxide, vinylcyclohexene dioxide, Celloxide, 2021P, or 8000 from Dicel Corporation, and the like, and two or more thereof can be used in combination. These can be synthesized by a conventional method, or a commercially available product can also be used. By using the alicyclic epoxy compound, physical properties such as colorless transparency, low temperature hardenability and chemical resistance, and heat resistance durability at high temperature and high humidity can be secured upon curing of the curable composition according to the present application.

In one example, the curable compound can further comprise a compound having an oxetane group. In this specification, the term compound having an oxetane group or oxetane compound can mean a compound having at least one oxetanyl group, where the oxetanyl group can mean a quaternary cyclic ether group in the molecular structure.

As the oxetane compound, a compound having one oxetanyl group in the molecule (hereinafter referred to as "monofunctional oxetane") and a compound having two or more oxetanyl groups in the molecule (hereinafter referred to as "polyfunctional oxetane") can be included as an example.

As the monofunctional oxetane, alkoxyalkyl group-containing monofunctional oxetane containing such as 3-ethyl-3-(2-ethylhexyloxymethyl)oxetane, aromatic group-containing monofunctional oxetane such as 3-ethyl-3-phenoxymethyloxetane, hydroxyl group-containing monofunctional oxetane such as 3-ethyl-3-hydroxymethyloxetane, or the like can be used.

As the polyfunctional oxetane, 3-ethyl-3-[(3-ethyloxetan-3-yl)methoxy-methyl]oxetane, 1,4-bis[(3-ethyloxetan-3-yl)methoxymethyl]benzene, 1,4-bis[(3-ethyl-oxetan-3-yl)methoxy]benzene, 1,3-bis[(3-ethyloxetan-3-yl)methoxy]benzene, 1,2-bis[(3-ethyloxetan-3-yl)methoxy]benzene, 4,4'-bis[(3-ethyloxetan-3-yl)methoxy]biphenyl, 2,2'-bis[(3-ethyloxetan-3-yl)methoxy]biphenyl, 3,3',5,5'-tetramethyl-4,4'-bis[(3-ethyloxetan-3-yl)methoxy]biphenyl,2,7-bis[(3-ethyloxetan-3-yl)methoxy]naphthalene, bis[4-{(3-ethyloxetan-3-yl)methoxy}phenyl]methane, bis[2-{(3-ethyloxetan-3-yl)methoxy}phenyl]-methane, 2,2-bis[4-{(3-ethyloxetan-3-yl)methoxy}phenyl]propane, a modified product etherified by 3-chloromethyl-3-ethyloxetane of a novolac phenol-formaldehyde resin, 3(4),8(9)-bis[(3-ethyl-oxetan-3-yl)methoxymethyl]-tricyclo[5.2.1.0$^{2,6}$]decane, 2,3-bis[(3-ethyloxetan-3-yl)methoxymethyl]norbornane, 1,1,1-tris[(3-ethyloxetan-3-yl)methoxy-methyl]propane, 1-butoxy-2,2-bis[(3-ethyloxetan-3-yl)methoxymethyl]butane, 1,2-bis[{2-(3-ethyloxetan-3-yl)methoxy}ethylthio] ethane, bis[{4-(3-ethyloxetan-3-yl)methylthio}-phenyl]sulfide, 1,6-bis[(3-ethyloxetan-3-yl)methoxy]-2,2,3,3,4,4,5,5-octafluorohexane, a hydrolyzed condensate of 3-[(3-ethyloxetan-3-yl)methoxy]propyltriethoxysilane, a condensate of tetrakis[(3-ethyloxetan-3-yl)methyl] silicate, or the like can be used.

In one example, the curable compound can comprise an epoxy compound having a cyclic structure and/or a compound having an oxetane group in the above-described molecular structure. That is, the curable compound can be composed of an epoxy compound having a cyclic structure in the molecular structure alone without an oxetane compound, but is not limited thereto, and can further comprise a compound having an oxetane group. When the compound having an oxetane group is further included, the compound having an oxetane group can be included in a range of 3 to 50 parts by weight relative to 100 parts by weight of the epoxy compound having a cyclic structure in the molecular structure. The lower limit of the content range can be 3.5 parts by weight or more, 4 parts by weight or more, 4.5 parts by weight or more, 5.1 parts by weight or more, 10 parts by weight or more, 20 parts by weight or more, 30 parts by weight or more, or 35 parts by weight or more. The lower limit of the content range can be in a range of 48 parts by weight or less, 45 parts by weight or less, 44 parts by weight or less, 43 parts by weight or less, 40 parts by weight or less, 35 parts by weight or less, 25 parts by weight or less, 15 parts by weight or less, or 8 parts by weight or less. The present application can provide a composition in which the pot life is sufficiently secured while allowing a uniform coating film in the process of encapsulating the top surface of the organic electronic element, by controlling the content ratio.

In one example, the curable compound can be a compound having a weight average molecular weight of 300 g/mol or less. The compound can have a weight average molecular weight in a range of 50 g/mol to 295 g/mol, 100 g/mol to 288 g/mol, or 120 g/mol to 275 g/mol. The present application makes it possible to form a uniform coating film after coating, while realizing excellent coating properties of an encapsulating composition to be applied in a liquid phase, by comprising the low molecular weight curable compound.

In this specification, the weight average molecular weight means a value converted to standard polystyrene as measured by GPC (gel permeation chromatograph).

In an embodiment of the present application, the thermal initiator can be a thermal cationic initiator. The thermal cationic initiator can comprise a sulfonium salt, a phosphonium salt, a quaternary ammonium salt, a diazonium salt or a iodonium salt, which has $BF_4^-$, $ASF_6^-$, $PF_6^-$, $SbF_6^-$, or $(BX_4)^-$ (wherein X is a phenyl group substituted with at least two fluorine or trifluoromethyl groups) as an anion.

The sulfonium salt can include triphenylsulfonium boron tetrafluoride, triphenylsulfonium antimony hexafluoride, triphenylsulfonium arsenic hexafluoride, tri(4-methoxyphenyl)sulfonium arsenic hexafluoride, diphenyl(4-phenylthiophenyl)sulfonium arsenic hexafluoride, or the like.

The phosphonium salt can include ethyltriphenylphosphonium antimony hexafluoride, tetrabutylphosphonium antimony hexafluoride, or the like.

The quaternary ammonium salt can include dimethylphenyl(4-methoxy-benzyl)ammonium hexafluorophosphate, dimethylphenyl(4-methoxybenzyl)ammonium hexafluoroantimonate, dimethylphenyl(4-methoxybenzyl)ammonium tetrakis(pentafluoro-phenyl)borate, dimethylphenyl(4-methylbenzyl)ammonium hexafluorohexafluoro-phosphate, dimethylphenyl(4-methylbenzyl)ammonium hexafluoroantimonate, dimethylphenyl(4-methylbenzyl)ammonium hexafluorotetrakis(pentafluorophenyl)borate, methylphenyldibenzyl ammonium, methylphenyldibenzylammonium hexafluoroantimonate hexafluorophosphate, methylphenyldibenzylammonium tetrakis(pentafluorophenyl)borate, phenyltribenzylammonium tetrakis(pentafluorophenyl)borate, dimethylphenyl(3,4-dimethylbenzyl)ammonium tetrakis(pentafluorophenyl)borate, N,N-dimethyl-N-benzylanilinium antimony hexafluoride, N,N-diethyl-N-benzylanilinium boron tetrafluoride, N,N-dimethyl-N-benzylpyridinium antimony hexafluoride, N,N-diethyl-N-benzylpyridinium trifluoromethanesulfonic acid, or the like.

The iodonium ion can include diphenyliodonium, di-p-tolyliodonium, bis(4-dodecylphenyl)iodonium, bis(4-methoxyphenyl)iodonium, (4-octyloxyphenyl)phenyl-iodonium, bis(4-decyloxyphenyl)iodonium, 4-(2-hydroxytetradecyloxy)phenylphenyl-iodonium, 4-isopropylphenyl(p-tolyl)iodonium, isobutylphenyl(p-tolyl)iodonium, or the like.

In an embodiment of the present application, the thermal initiator can comprise 0.01 to 1 part by weight relative to 100 parts by weight of the curable compound. In one example, the lower limit of the thermal initiator can be 0.02 parts by weight or more, 0.03 parts by weight or more, 0.04 parts by weight or more, 0.05 parts by weight or more, 0.06 parts by weight or more, 0.09 parts by weight or more, 0.12 parts by weight or more, or 0.18 parts by weight or more. Also, the upper limit of the thermal initiator can be 1 part by weight or less, 0.8 parts by weight or less, 0.5 parts by weight or less, 0.3 parts by weight or less, 0.25 parts by weight or less, 0.2 parts by weight or less, 0.19 parts by weight or less, 0.13 parts by weight or less, or 0.09 parts by weight or less. The composition for encapsulating an organic electronic element according to the present application can realize hardness at the time of curing by comprising a thermal initiator in the above weight ratio range, whereby an encapsulating material having sufficient curing performance in encapsulating the top surface of the element and high endurance reliability as out-gas is suppressed at high temperatures after curing can be provided. Generally, the main components of out-gas are uncured compound and initiator residues, but the present application provides an encapsulating composition capable of simultaneously realizing optical properties, element stability, processability and thermal stability in the compositional formulation of the present application by combining the above-described specific curable compound and the initiator, provided that the content ratio of an initiator and a hardening retarder is controlled as in the above-described Equation 1.

The curable composition according to the present application can comprise a hardening retarder. The hardening retarder can be one or more selected from the group consisting of an amine-based compound, a polyether-based compound, boric acid, phenylboric acid, salicylic acid, hydrochloric acid, sulfuric acid, oxamic acid, tetraphthalic acid, isophthalic acid, phosphoric acid, acetic acid, and lactic acid. In one example, the hardening retarder can have a cyclic structure in the molecular structure, taking into account the objects and effects of the present invention as described above. In the cyclic structure, ring constituent atoms within the molecular structure can be present in a range of 3 to 40, 4 to 35, or 5 to 30, and the cyclic structure in the compound can be present in 1 or more, or 2 or more and 10 or less. The cyclic structure can be alicyclic or aromatic, but is not limited thereto.

In one example, the polyether-based compound can be polyethylene glycol, polypropylene glycol, polytetramethylene glycol or a crown ether compound, and preferably can be a crown ether compound. The crown ether compound can be 12-crown-4-ether, 15-crown-5-ether, 18-crown-6-ether or 24-crown-8-ether, but is not limited thereto. The amine-based compound can be exemplified by aniline or benzylamine, but is not limited thereto.

Here, the hardening retarder can be a compound having a structure of Formula 11 below.

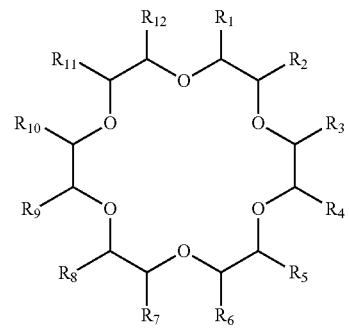

[Formula 11]

In Formula 11, at least one of $R_1$ to $R_{12}$ represents is an alkyl group having 1 to 20 carbon atoms and the remainder represent are hydrogen, where the alkyl group can be substituted with one or more functional groups selected from the group consisting of a linear or branched alkoxyl group having 1 to 20 carbon atoms, a halogen atom, an —OH group, a —COOH group and a —COO-alkyl ester group (provided that the alkyl moiety is a linear or branched residue having 1 to 20 carbon atoms).

In addition, the crown ether compound can comprise a cyclohexyl group. The crown ether compound comprising a cyclohexyl group can be a compound having a structure of Formula 12 below.

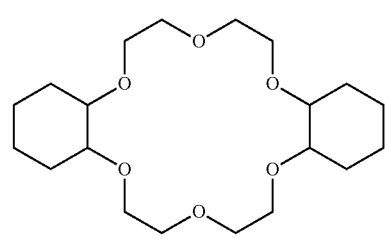

[Formula 12]

In this specification, when a formula is expressed, the case having no indication of an element can mean carbon, and the case having no indication of the element bonded with carbon can mean hydrogen.

In one example, the present application can vary the ratio of the above-described Equation 1 depending on the kind of the hardening retarder. For example, when the hardening retarder is a polyether-based compound, R/P can be in a range of more than 0.1, less than 0.5, 0.15 to 0.495, 0.2 to 0.493, 0.3 to 0.45, or 0.35 to 0.42. Also, when the hardening retarder is an amine-based compound, R/P can be in a range of more than 0.03, 0.1 or less, or 0.031 to 0.05. In the present application, the initiator and the retarder can be selected depending on the kind of the curable compound, and the appropriate content ratio in the compositional formulation of the present application can be adjusted depending on the kind of the hardening retarder. The present application provides an encapsulating composition capable of simultaneously realizing optical properties, element stability, processability and thermal stability by controlling the content ratio.

In an embodiment of the present application, the hardening retarder can comprise 0.002 to 0.12 parts by weight relative to 100 parts by weight of the curable compound. The lower limit of the hardening retarder can be 0.004 parts by weight, 0.006 parts by weight, 0.008 parts by weight, 0.01 parts by weight, 0.02 parts by weight, 0.023 parts by weight or 0.025 parts by weight. Also, the upper limit of the hardening retarder can be 0.11 parts by weight, 0.10 parts by weight, 0.09 parts by weight, 0.08 parts by weight, 0.07 parts by weight, 0.045 parts by weight or 0.023 parts by weight. Furthermore, the content of the hardening retarder can be set differently depending on the kind of the hardening retarder and specifically, when the hardening retarder is a polyether-based compound, the hardening retarder can be included in an amount of 0.008 to 0.12 parts by weight, and when the hardening retarder is an amine-based compound, the hardening retarder can be included in an amount of 0.004 to 0.08 parts by weight.

In one example, the encapsulating composition can have excellent light transmittance over the visible light region after curing. In one example, the encapsulating composition of the present application can exhibit light transmittance of 90% or more according to JIS K7105 standard after curing. For example, the encapsulating composition can have light transmittance of 92% or more, or 93% or more over the visible light region. Furthermore, the encapsulating material of the present application can exhibit low haze with excellent light transmittance. In one example, the encapsulating composition can have haze of 5% or less, 4% or less, 3% or less, or 1% or less as measured according to the standard of JIS K7105 after curing. The optical properties can be measured at 550 nm using a UV-Vis spectrometer.

The encapsulating composition of the present application can comprise a moisture adsorbent, if necessary. After the encapsulating composition is cured, the moisture adsorbent can impart a haze characteristic and a light diffusion characteristic thereto, and in this case, the haze range can be higher than the above-mentioned range. The term "moisture adsorbent" can be used to collectively mean a component capable of adsorbing or removing moisture or humidity introduced from the outside through physical or chemical reaction or the like. That is, it means a moisture-reactive adsorbent or a physical adsorbent, and a mixture thereof is also usable.

The moisture-reactive adsorbent chemically reacts with moisture, humidity or oxygen introduced into the encapsulating composition or the cured product thereof to adsorb the moisture or humidity. The physical adsorbent can increase the moving path of moisture or humidity penetrating a resin composition or the cured product thereof to suppress the penetration, and maximize a barrier property to moisture and humidity through interaction with a matrix structure of the resin composition or the cured product thereof and the moisture-reactive adsorbent, and the like.

The specific kind of the moisture adsorbent which can be used in the present application is not particularly limited, and for example, in the case of a moisture-reactive adsorbent, it can include one or a mixture of two or more of a metal oxide, a metal salt or phosphorus pentoxide ($P_2O_5$), and the like, and in the case of a physical adsorbent, it can include zeolite, zirconia or montmorillonite, and the like.

Here, a specific example of the metal oxide can include lithium oxide ($Li_2O$), sodium oxide ($Na_2O$), barium oxide (BaO), calcium oxide (CaO) or magnesium oxide (MgO), and the like, and an example of the metal salt can include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, without being limited thereto.

In the present application, the moisture adsorbent such as the metal oxide can be compounded in the composition in a properly processed state. For example, a pulverization process of the moisture adsorbent can be required, and a process such as a three-roll mill, a bead mill or a ball mill can be used for pulverizing the moisture adsorbent.

The encapsulating composition of the present application can comprise the moisture adsorbent in an amount of 5 parts by weight to 100 parts by weight, 5 to 80 parts by weight, 5 parts by weight to 70 parts by weight, or 10 to 30 parts by weight, relative to 100 parts by weight of the curable compound. As the encapsulating composition of the present application preferably controls the content of the moisture adsorbent to 5 parts by weight or more, the encapsulating composition or the cured product thereof can exhibit excellent moisture and humidity barrier properties. In addition, when the content of the moisture adsorbent is controlled to 100 parts by weight or less to form a thin film encapsulating structure, the composition can exhibit excellent moisture barrier properties.

The encapsulating composition according to the present application can comprise various additives in addition to the above-mentioned constitution within the range without affecting the above-described effects of the invention. For example, the encapsulating composition can comprise an antifoaming agent, a coupling agent, a tackifier, an ultraviolet stabilizer or an antioxidant, and the like in an appropriate range of content depending on the intended physical properties. In one example, the encapsulating composition can further comprise an antifoaming agent. The present application can realize antifoaming characteristics in the above-described coating process of the encapsulating composition by comprising the antifoaming agent to provide a reliable encapsulating structure. The kind of the antifoaming agent is not particularly limited as long as the physical properties of the encapsulating composition required in the present application are satisfied.

In one example, the encapsulating composition can be in a liquid state at room temperature, for example, at about 25° C. In an embodiment of the present application, the encapsulating composition can be a solventless type liquid phase. The encapsulating composition can be applied to encapsulating an organic electronic element, and specifically, can be applied to encapsulating the top surface of an organic electronic element. As the encapsulating composition has a form of a liquid phase at room temperature, the present application can encapsulate the element by a method of applying the composition to the top surface of the organic electronic element.

In one example, the encapsulating composition can have the viscosity of 500 cP or less, 350 cP or less, 200 cP or less, 180 cP or less, 150 cP or less, 100 cP or less, or 90 cP or less at a temperature of 25° C. and a rotation speed condition of 100 rpm. The lower limit thereof is not particularly limited, but can be 10 cP or more, or 30 cP or more. The viscosity was measured with torque on an RV-63 spindle using a Brookfield viscometer (LV type).

Furthermore, in one example, the encapsulating composition of the present application can have a b* value in the CIE LAB color space after curing in a range of 0.1 to 0.4, 0.15 to 0.35, 0.2 to 0.3, 0.2 to 0.26, or 0.2 to 0.24. Here, the upper limit can be more specifically 0.225 or less, or 0.215 or less. In this specification, the term "CIE (Commission Internationale de l'Eclairage) LAB color space" means a color space defined by the CIE in order to easily express an error range and direction of a color of an object. The CIE LAB color space represents a color space with L*, a* and b*, where L* represents reflectance (lightness), which can be expressed in units of decimals in steps of 0 to 100. a* and b* are chromaticity diagrams, where +a* represents a red direction, −a* represents a green direction, +b* represents a yellow direction, and −b* represents a blue direction.

The present application also relates to an organic electronic device. As shown in FIG. 1, an exemplary organic electronic device can comprise a substrate (21); an organic electronic element (23) formed on the substrate (21); and a top encapsulating layer (11) sealing the top surface of the organic electronic element (23) and comprising the above-described encapsulating composition. In addition, the exemplary organic electronic device can further comprise a side encapsulating layer (10) formed on the substrate (21) so as to surround the side surface of the organic electronic element (23). Accordingly, the organic electronic device can have an encapsulating structure (1) composed of a top encapsulating layer (11) and a side encapsulating layer (10).

The top encapsulating layer and the side encapsulating layer can be present on the same plane. Here, the "same" can mean substantially the same. For example, the 'substantially the same on the same plane' means that it can have an error of ±5 μm or ±1 μm in the thickness direction. The top encapsulating layer can encapsulate the upper surface of the organic electronic element formed on the substrate, and can also encapsulate the side surfaces together, as well as the upper surface. The side encapsulating layer can be formed on the side surface of the element, but may not directly contact the side surface of the organic electronic element. For example, the element can be encapsulated so that the top encapsulating layer directly contacts the top surface and the side surfaces of the element. That is, in a plan view of an organic electronic device, the side encapsulating layer can be located at the periphery of the substrate without contacting the element.

In this specification, the term "periphery" means a circumferential edge portion. That is, the periphery of the substrate can mean the circumferential edge portion in the substrate.

The organic electronic device of the present application can further comprise a cover substrate (22) present on the top encapsulating layer. The material of the substrate or the cover substrate is not particularly limited, and materials known in the art can be used. For example, the substrate or the cover substrate can be glass or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used.

The material constituting the side encapsulating layer is not particularly limited and can be an adhesive composition or a pressure-sensitive adhesive composition. The side encapsulating layer can comprise an encapsulating resin, where the encapsulating resin can be exemplified by an acrylic resin, an epoxy resin, a silicone resin, a fluororesin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin or a mixture thereof, and the like. The component constituting the side encapsulating layer can be the same as or different from the above-mentioned encapsulating composition.

In one example, the organic electronic element can comprise a reflective electrode layer (or a transparent electrode layer) formed on a substrate, an organic layer formed on the reflective electrode layer (or transparent electrode layer) and comprising at least a light emitting layer, and a transparent electrode layer (or a reflective electrode layer) formed on the organic layer.

In the present application, the organic electronic element (23) can be an organic light emitting diode.

In one example, the organic electronic device according to the present application can be a top emission type, but is not limited thereto, and can also be applied to a bottom emission type.

The organic electronic element can further comprise a protective film for protecting the electrode and the light emitting layer of the element. The protective film can have a structure in which an organic film and an inorganic film are alternately laminated. The protective film can be a protective layer formed by chemical vapor deposition (CVD), where a known inorganic material can be used as the material and for example, silicon nitride (SiNx) can be used. In one example, the silicon nitride (SiNx) used as the protective film can be deposited to a thickness of 0.01 μm to 5 μm.

The above-described encapsulating composition can be in direct contact with the electrode of the organic electronic element or the protective film.

In addition, the present application relates to a method for manufacturing an organic electronic device.

In one example, the manufacturing method can comprise steps of: applying the above-described encapsulating composition on the substrate (21), on which the organic electronic element (23) is formed, so as to seal the top surface of the organic electronic element (23); and curing the composition. The step of applying the encapsulating composition can be a step of forming the above-described top encapsulating layer (11).

Here, the substrate (21) on which the organic electronic element (23) is formed can be produced by forming a reflective electrode or a transparent electrode on a substrate (21) such as glass or a film by a method such as vacuum deposition or sputtering, and then forming an organic material layer on the reflective electrode. The organic material layer can comprise a hole injecting layer, a hole transporting layer, a light emitting layer, an electron injecting layer and/or an electron transporting layer. Then, a second electrode is further formed on the organic material layer. The second electrode can be a transparent electrode or a reflective electrode. Then, the above-described top encapsulating layer (11) is applied to cover the top surface of the organic electronic element (23) on the substrate (21). At this time, the method of forming the top encapsulating layer (11) is not particularly limited, and the above-described encapsulating composition can be applied to the top surface of the substrate (21) with a process such as screen printing or dispenser application. Furthermore, the side encapsulating layer (10) for sealing the side surfaces of the organic electronic element (23) can be applied. The method of forming the top encapsulating layer (11) or the side encapsulating layer (10) can be applied by a known method in the art, and for example, a liquid crystal drop injection (one drop fill) process can be used.

Furthermore, in the present invention, a curing process can also be performed on the top or side encapsulating layer that encapsulates the organic electronic device, where this curing process (final curing) can be performed, for example, in a heating chamber. The conditions upon the final curing can be appropriately selected in consideration of the stability of the organic electronic device, and the like.

In one example, the above-mentioned encapsulating composition can be applied to form a top encapsulating layer, followed by thermal curing. It can comprise thermally curing the encapsulating composition at a temperature of 40° C. to 200° C., 50° C. to 180° C., 60° C. to 170° C., 70° C. to 160° C., 80° C. to 150° C. or 90° C. to 130° C. for 1 hour to 24 hours, 1 hour to 20 hours, 1 hour to 10 hours, or 1 hour to 5 hours. Through the step of applying heat, the encapsulating composition can be subjected to final curing.

Advantageous Effects

As a composition for encapsulating an organic electronic element is applied to an organic electronic device, the present application can form a structure capable of effectively blocking moisture or oxygen introduced from the outside into the organic electronic device, thereby securing a lifetime of the organic electronic device. Also, the composition can be applied to a top-emitting organic electronic device to prevent physical and chemical damage of organic electronic elements, while having excellent optical properties and processability, even if it is applied in direct contact with the organic electronic element.

BRIEF DESCRIPTION OF DRAWINGS

FIG. 1 is a cross-sectional diagram showing an organic electronic device according to one example of the present invention.

EXPLANATION OF REFERENCE NUMERALS

1: encapsulating structure
10: side encapsulating layer
11: top encapsulating layer
21: substrate
22: cover substrate
23: organic electronic element

BEST MODE

Hereinafter, the present invention will be described in more detail with reference to examples according to the present invention and comparative examples not according to the present invention, but the scope of the present invention is not limited by the following examples.

Example 1

At room temperature, an alicyclic epoxy compound (Celloxide 2021P from Daicel Corporation, Mw 270 g/mol) and an oxetane compound (OXT-101 from TOAGOSEI Co., Ltd.) as a curable compound were introduced into a mixing vessel at a ratio by weight of 77:23 (Celloxide 2021P:OXT-101). 0.15 parts by weight of a thermal cationic initiator (King Industries, Inc., CXC-1612) and 0.050 parts by weight of 18-crown-6-ether as a hardening retarder were introduced to the vessel, relative to 100 parts by weight of the curable compound. The mixed solution was stirred to prepare a uniform composition solution.

Example 2

At room temperature, an alicyclic epoxy compound (Celloxide 2021P from Daicel Corporation, Mw 270 g/mol) and an alicyclic epoxy compound (Celloxide 8000 from Daicel Corporation) as a curable compound were introduced into a mixing vessel at a ratio by weight of 70:30 (Celloxide 2021P:Celloxide 8000). 0.06 parts by weight of a thermal cationic initiator (King Industries, Inc., CXC-1612) and 0.024 parts by weight of 18-crown-6-ether as a hardening retarder were introduced to the vessel, relative to 100 parts by weight of the curable compound. The mixed solution was stirred to prepare a uniform composition solution.

Example 3

At room temperature, an alicyclic epoxy compound (Celloxide 2021P from Daicel Corporation, Mw 270 g/mol), an alicyclic epoxy compound (Celloxide 8000 from Daicel Corporation) and an oxetane compound (OXT-221 from TOAGOSEI Co., Ltd., Mw 210 g/mol) as a curable compound were introduced into a mixing vessel at a ratio by weight of 30:65:5 (Celloxide 2021P:Celloxide 8000:OXT-221). 0.06 parts by weight of a thermal cationic initiator (King Industries, Inc., CXC-1612) and 0.024 parts by weight of 18-crown-6-ether as a hardening retarder were introduced to the vessel, relative to 100 parts by weight of the curable compound. The mixed solution was stirred to prepare a uniform composition solution.

Example 4

At room temperature, an alicyclic epoxy compound (Celloxide 2021P from Daicel Corporation, Mw 270 g/mol) and an alicyclic epoxy compound (Celloxide 8000 from Daicel Corporation) as a curable compound were introduced into a mixing vessel at a ratio by weight of 70:30 (Celloxide 2021P:Celloxide 8000). 0.06 parts by weight of a thermal cationic initiator (King Industries, Inc., CXC-1821) and 0.020 parts by weight of 18-crown-6-ether as a hardening retarder were introduced to the vessel, relative to 100 parts by weight of the curable compound. The mixed solution was stirred to prepare a uniform composition solution.

Example 5

At room temperature, an alicyclic epoxy compound (Celloxide 2021P from Daicel Corporation, Mw 270 g/mol) and an alicyclic epoxy compound (Celloxide 8000 from Daicel Corporation) as a curable compound were introduced into a mixing vessel at a ratio by weight of 70:30 (Celloxide 2021P:Celloxide 8000). 0.1 parts by weight of a thermal cationic initiator (King Industries, Inc., CXC-1612) and 0.021 parts by weight of 18-crown-6-ether as a hardening retarder were introduced to the vessel, relative to 100 parts by weight of the curable compound. The mixed solution was stirred to prepare a uniform composition solution.

Example 6

At room temperature, an alicyclic epoxy compound (Celloxide 2021P from Daicel Corporation, Mw 270 g/mol) and an oxetane compound (OXT-221 from TOAGOSEI Co., Ltd., Mw 210 g/mol) as a curable compound were introduced into a mixing vessel at a ratio by weight of 70:30 (Celloxide 2021P:OXT-221). 0.1 parts by weight of a thermal cationic initiator (King Industries, Inc., CXC-1821) and 0.049 parts by weight of 18-crown-6-ether as a hardening retarder were introduced to the vessel, relative to 100 parts by weight of the curable compound. The mixed solution was stirred to prepare a uniform composition solution.

Example 7

At room temperature, an alicyclic epoxy compound (Celloxide 2021P from Daicel Corporation, Mw 270 g/mol) and an oxetane compound (OXT-221 from TOAGOSEI Co., Ltd., Mw 210 g/mol) as a curable compound were introduced into a mixing vessel at a ratio by weight of 75:25 (Celloxide 2021P:OXT-221). 0.2 parts by weight of a thermal cationic initiator (King Industries, Inc., CXC-1821) and 0.0062 parts by weight of benzylamine as a hardening retarder were introduced to the vessel, relative to 100 parts by weight of the curable compound. The mixed solution was stirred to prepare a uniform composition solution.

Comparative Example 1

An encapsulating composition solution was prepared in the same manner as in Example 2, except that 0.0018 parts by weight of 18-crown-6-ether as a hardening retarder was introduced thereto, relative to 100 parts by weight of the curable compound.

Comparative Example 2

An encapsulating composition solution was prepared in the same manner as in Comparative Example 1, except that 0.04 parts by weight of 18-crown-6-ether as a hardening retarder was introduced thereto, relative to 100 parts by weight of the curable compound.

Comparative Example 3

An encapsulating composition solution was prepared in the same manner as in Example 1, except that no hardening retarder was introduced.

Comparative Example 4

An encapsulating composition solution was prepared in the same manner as in Example 4, except that no hardening retarder was introduced.

Comparative Example 5

At room temperature, an alicyclic epoxy compound (Celloxide 2021P from Daicel Corporation, Mw 270 g/mol) and an alicyclic epoxy compound (Celloxide 8000 from Daicel Corporation) as a curable compound were introduced into a mixing vessel at a ratio by weight of 70:30 (Celloxide 2021P:Celloxide 8000). 0.1 parts by weight of a photo cationic initiator (CPI-101A) and 0.049 parts by weight of 18-crown-6-ether as a hardening retarder were introduced to the vessel, relative to 100 parts by weight of the curable compound. The mixed solution was stirred to prepare a uniform composition solution.

The physical properties in Examples and Comparative Examples were evaluated in the following manner.

1. Viscosity Measurement

The viscosity of each of the compositions prepared in Examples and Comparative Examples was measured using a Brookfield viscometer (LV type) as follows.

For the above-prepared curable compositions, the viscosity was measured at a temperature of 25° C. and a rotation speed of 100 rpm. Specifically, the viscosity was measured according to the torque at the RV-63 spindle of Brookfield viscometer.

2. Pot Life Measurement

After 40 g of each of the compositions prepared in Examples and Comparative Examples was sealed in a glass bottle, it was allowed to stand in an oven at 35° C. to measure the viscosity every 24 hours. Specifically, the time at which the viscosity became 1.5 times the initial viscosity immediately before the sealing was recorded. It was classified as excellent for the case of 100 hours or more, good for the case of 60 hours or more and poor for the case of less than 60 hours.

3. Measurement of Light Transmittance and b*

The compositions prepared in Examples and Comparative Examples were each applied between non-alkali glass (0.7 T) substrates and then heated at 100° C. for 30 minutes to form an encapsulating layer having a thickness of 50 μm.

The light transmittance was measured as light transmittance at 550 nm using a UV-Vis spectrometer.

On the other hand, the b* value was measured according to ASTM D 1003 standard using a COH 400 transmittance measuring instrument from Nippon Denshoku.

4. Out-Gas Measurement

Measuring instrument: Purge & Trap sampler-GC/MSD system (P & T: JAI JTD-505111, GC/MS: Agilent 7890B/5977A)

300 g of each of the compositions prepared in Examples and Comparative Examples was cured by applying heat at 100° C. for 1 hour. The cured sample was immersed in a test tube and placed in the measuring instrument. In the instrument, the Purge and Trap was performed at 100° C. for 60 minutes, and then the total volatilization volume was measured using GC-MS.

The area of each component of the sample was converted to the weight of toluene as the reference material, and then divided by the weight of the sample to calculate the out-gas content.

It was classified as excellent for the case of 12 ppm or less, good for the case of 100 ppm or less and poor for the case of more than 100 ppm.

TABLE 1

| | | R/P | Viscosity (cP) | Pot Life (hour) | Light Transmittance (%) | b* | Out-gas (ppm) |
|---|---|---|---|---|---|---|---|
| Example | 1 | 0.33 | 84 | 105 | 92.3 | 0.21 | 24 |
| | 2 | 0.4 | 155 | 87 | 92.5 | 0.23 | 10 |
| | 3 | 0.4 | 89 | 185 | 93.2 | 0.23 | 15 |
| | 4 | 0.33 | 155 | 90 | 92.5 | 0.22 | 11 |
| | 5 | 0.21 | 155 | 72 | 92.5 | 0.22 | 8 |
| | 6 | 0.49 | 81 | 207 | 93.0 | 0.21 | 42 |
| | 7 | 0.031 | 97 | 150 | 93.1 | 0.27 | 15 |
| Comparative Example | 1 | 0.03 | 155 | 10 | 92.7 | 0.21 | 9 |
| | 2 | 0.67 | 155 | 165 | 92.5 | 0.22 | 120 |
| | 3 | — | 84 | 20 | 92.8 | 0.22 | 20 |
| | 4 | — | 155 | 32 | 92.1 | 0.25 | 13 |
| | 5 | 0.49 | 155 | 190 | 92.7 | 0.25 | 150 |

The invention claimed is:

1. A composition for encapsulating an organic electronic element, comprising:
   a curable compound comprising a compound having an oxetane group;
   a thermal initiator; and
   a hardening retarder,
   and satisfying Equation 1 below, $$0.03 < R/P < 0.6 \quad \text{[Equation 1]}$$

wherein R is a part by weight of the hardening retarder relative to 100 parts by weight parts of the curable compound, and P is a part by weight of the thermal initiator relative to 100 parts by weight of the curable compound.

2. The composition according to claim 1, wherein the curable compound comprises at least one or more curable functional groups.

3. The composition according to claim 2, wherein the curable functional group is one or more selected from a glycidyl group, an isocyanate group, a hydroxyl group, a carboxyl group, an amide group, an epoxide group, a cyclic ether group, a sulfide group, an acetal group and a lactone group.

4. The composition according to claim 1, wherein the curable compound further comprises an epoxy compound having a cyclic structure in the molecular structure.

5. The composition according to claim 4, wherein the epoxy compound having a cyclic structure in the molecular structure has 3 to 10 ring constituent atoms.

6. The composition according to claim 4, wherein the epoxy compound having a cyclic structure in the molecular structure is an alicyclic epoxy compound.

7. The composition according to claim 4, wherein an amount of the compound having an oxetane group in the curable compound is in a range of 3 to 50 parts by weight relative to 100 parts by weight of the epoxy compound.

8. The composition according to claim 1, wherein the curable compound has a weight average molecular weight of 300 g/mol or less.

9. The composition according to claim 1, wherein the thermal initiator is a thermal cationic initiator.

10. The composition according to claim 1, wherein the thermal initiator comprises a sulfonium salt, a phosphonium salt, a quaternary ammonium salt, a diazonium salt or a iodonium salt, which has $BF_4^-$, $ASF_6^-$, $PF_6^-$, $SbF_6^-$, or $(BX_4)^-$ as an anion, where X is a phenyl substituted with at least two fluorine or trifluoromethyl groups.

11. The composition according to claim 1, wherein the thermal initiator is included in an amount of 0.01 to 1 part by weight relative to 100 parts by weight of the curable compound.

12. The composition according to claim 1, wherein the hardening retarder comprises one or more selected from the group consisting of an amine-based compound, a polyether-based compound, boric acid, phenylboric acid, salicylic acid, hydrochloric acid, sulfuric acid, oxamic acid, tetraphthalic acid, isophthalic acid, phosphoric acid, acetic acid, and lactic acid.

13. The composition according to claim 1, wherein R/P is in a range of more than 0.1 and less than 0.5 when the hardening retarder is a polyether-based compound, and R/P is in a range of more than 0.03 and 0.1 or less when the hardening retarder is an amine-based compound.

14. The composition according to claim 1, wherein the hardening retarder is included in an amount of 0.002 to 0.12 parts by weight relative to 100 parts by weight of the curable compound.

15. An organic electronic device, comprising:
a substrate;
an organic electronic element formed on the substrate; and
a top encapsulating layer which seals the top surface of the organic electronic element and comprises the composition for encapsulating an organic electronic element according to claim 1.

16. The organic electronic device according to claim 15, further comprising a side encapsulating layer formed so as to surround the side surfaces of the organic electronic element on the substrate, wherein the side encapsulating layer and the top encapsulating layer are present on the same plane.

17. A method for manufacturing an organic electronic device comprising steps of:
applying the composition for encapsulating an organic electronic element of claim 1 on a substrate, on which the organic electronic element is formed, so as to seal the top surface of the organic electronic element; and
curing the composition.

* * * * *